[12] United States Patent
Shindou et al.

(10) Patent No.: US 6,677,626 B1
(45) Date of Patent: Jan. 13, 2004

(54) SEMICONDUCTOR DEVICE WITH ALTERNATING CONDUCTIVITY TYPE LAYER AND METHOD OF MANUFACTURING THE SAME

(75) Inventors: Youichi Shindou, Kanagawa (JP); Yasushi Miyasaka, Nagano (JP); Tatsuhiko Fujihira, Nagano (JP); Manabu Takei, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/438,077

(22) Filed: Nov. 10, 1999

(30) Foreign Application Priority Data

Nov. 11, 1998 (JP) ............................. 10-319672
Apr. 28, 1999 (JP) ........................... 11-121224

(51) Int. Cl.[7] ............................................. C21B 7/16
(52) U.S. Cl. ...................... 257/266; 257/287; 257/329; 257/492; 257/493; 257/655; 257/656; 438/268
(58) Field of Search ................. 257/266, 287, 257/329, 492, 493, 655; 438/268

(56) References Cited

U.S. PATENT DOCUMENTS

| 4,680,853 | A | * | 7/1987 | Lidow et al. | 29/571 |
| 5,130,767 | A | * | 7/1992 | Lidow et al. | 357/23.4 |
| 5,216,275 | A | | 6/1993 | Chen | 257/493 |
| 5,438,215 | A | * | 8/1995 | Tihanyi | 257/341 |
| 5,589,405 | A | * | 12/1996 | Contiero et al. | 148/DIG. 126 |
| 5,661,314 | A | * | 8/1997 | Merrill et al. | 257/144 |
| 5,723,882 | A | * | 3/1998 | Okabe et al. | 257/139 |
| 6,081,009 | A | * | 6/2000 | Neilson | 257/341 |

FOREIGN PATENT DOCUMENTS

EP 0053854 2/1986

OTHER PUBLICATIONS

Tatsuhiko Fujihira, "Theory of Semiconductor Superjunction Devices", Oct. 1997,pp. 6254–6262, Jpn. J. Appl. Phys. vol. 36 (1997), Part 1, No. 10.

* cited by examiner

*Primary Examiner*—Amir Zarabian
*Assistant Examiner*—Jeff Vockrodt
(74) *Attorney, Agent, or Firm*—Rossi & Associates

(57) ABSTRACT

This invention achieves a high inverse voltage of a superjunction semiconductor device, which has a drift layer composed of a parallel pn layer that conducts electricity in the ON state and is depleted in the OFF state. An n⁻ high resistance region is formed at the periphery of a drift layer composed of a parallel pn layer of n drift regions and p partition regions. The impurity density $N_D$ of the n⁻ high resistance region is $5.62 \times 10^{17} \times V_{DSS}^{-1.36}$ (cm⁻³) or less. $V_{DSS}$ denotes the withstand voltage (V). An n low resistance region is arranged adjacent to the n⁻ high resistance region.

19 Claims, 8 Drawing Sheets

SEMICONDUCTOR DEVICE WITH ALTERNATING CONDUCTIVITY TYPE LAYER AND METHOD OF MANUFACTURING THE SAME

FIELD OF THE INVENTION

The present invention relates to a semiconductor device, such as an insulated gate metal oxide semiconductor field-effect transistor (MOSFET), an insulated gate bipolar transistor (OGBT), a bipolar transistor and a diode, which has a special longitudinal structure composed of a parallel pn layer that conducts electricity in the ON state and is depleted in the OFF state.

BACKGROUND OF THE INVENTION

A high resistance layer between two electrodes provided on opposite two principal faces must be thick in order to achieve a high withstand voltage in a longitudinal semiconductor device, in which an electric current flows between the two electrodes. A device having the thick high resistance layer provides high ON-state resistance between the two electrodes, and thus, the loss is unavoidably increased. In short, there is a trade-off relationship between the ON-state resistance (the current-carrying capacity) and the withstand voltage. As is well known, the trade-off relationship applies to a variety of semiconductor devices such as an IGBT, a bipolar transistor and a diode. The problem also applies to a lateral semiconductor device in that a direction in which a drift current flows in the ON state is different from a direction in which a depletion layer spreads due to the reverse bias in the OFF state.

To address the above-mentioned problem, European Patent No. 0,053,854, U.S. Pat. No. 5,216,275, U.S. Pat. No. 5,438,215, and Japanese Patent Provisional Publication No. 9-266311 developed by the inventors of this invention have disclosed a semiconductor device having a drift layer composed of a parallel pn layer, in which n regions and p regions with high impurity density are alternately piled up. In this semiconductor device, the parallel pn layer is depleted in the OFF state to endure the withstand voltage.

FIG. 10 is a partial sectional view showing the longitudinal MOSFET according to a preferred embodiment of the U.S. Pat. No. 5,216,275. This MOSFET is characterized in that a drift layer 12, which is the single layer in the normal longitudinal semiconductor device, is a parallel pn layer composed of n drift regions 12a and p partition regions 12b. Reference numeral 13a denotes p well regions; numeral 13b denotes p+ contact regions; numeral 14 denotes n+ source regions; numeral 15 denotes a gate insulating film; numeral 16 denotes gate electrodes; numeral 17 denotes source electrodes; and numeral 18 denotes drain electrodes.

In the drift layer 12, for example, a high resistance n-type layer is grown by an epitaxial method, and trenches extending to the n+ drain layers are selectively etched to form the n drift regions 12a. Then, a p-type layer is grown in the trench by the epitaxial method to form the p partition regions 12b.

In the following description, a semiconductor device having a drift layer composed of a parallel pn layer, which conducts electricity in the ON state and is depleted in the OFF state, will be referred to as a super-junction semiconductor device.

The above-mentioned publications only describe the drift layer composed of the parallel pn layer, which conducts electricity, and fails to mention any voltage withstand structure for achieving the high withstand voltage provided at the periphery of the semiconductor device. If there is only provided the drift layer composed of the parallel pn layer without any voltage withstand structure, it is impossible to achieve the high withstand voltage.

Examples of the voltage withstand structure are a guard ring and a field plate. The semiconductor device should have a suitable structure for having the guard ring and the field plate. In this case, it is necessary to perform the process such as forming a mask, implanting and diffusing impurities, or coating and patterning metal film.

SUMMARY OF THE INVENTION

In view of the foregoing, it is an object of the present invention to provide a super-junction semiconductor device, which improves the trade-off relationship between the ON-resistance and the withstand voltage and easily achieves a high withstand voltage.

To achieve the above-mentioned object, the present invention is directed to a super-junction semiconductor device, which comprises first and second principal faces, electrodes provided on the principal faces, a low resistance layer between the first and second principal faces, and a parallel pn layer, in which first-conductivity-type drift regions and second-conductivity-type partition regions are arranged alternately, the parallel pn layer being provided between the two principal electrodes and conducting electricity in the ON state and being depleted in the OFF state, wherein a first-conductivity-type or second-conductivity-type high resistance region is formed at the periphery of the parallel pn layer A depletion layer spreads into the high resistance region formed at the periphery of the parallel pn layer when a reverse voltage is applied. This achieves the high withstand voltage. Particularly, if the withstand voltage of the super-junction semiconductor device is $V_{DSS}$ (V), the impurity density $N_D$ of the n⁻ high resistance region is $5.62 \times 10^{17} \times V_{DSS}^{-1.36}$ (cm⁻³) or less.

As described later in detail, if the density is as low as $5.62 \times 10^{17} \times V_{DSS}^{-1.36}$ (cm⁻³) or less, the depletion layer can spread satisfactorily even if there is provided no conventional guard ring structure, or the like. Consequently, the semiconductor device can have the high withstand voltage. Of course, it is possible to provide the device with the guard ring structure.

A low resistance region of the same conductivity type as the high resistance region is formed at the periphery of the high resistance region. The low resistance region connects to a low resistance layer formed below the semiconductor substrate.

A low resistance region of the same conductivity type as the high resistance region is formed at the periphery of the high resistance region. The low resistance region is used as channel stoppers to thereby decrease the leakage current.

An insulating film is formed on surface of the high resistance region in order to protect and stabilize the surfaces.

In the simplest structure, the sides of the semiconductor chip are covered with the low resistance region.

If first-conductivity-type high resistance region is formed at the periphery of the parallel pn layer, a net quantity of impurities in an outermost second-conductivity-type partition region is substantially equal to a net quantity of impurities in each region of the parallel pn layer inside the outermost partition region. If second-conductivity-type high resistance region is formed at the periphery of the parallel pn layer, a net quantity of impurities in an outermost first-conductivity-type drift region is substantially equal to a net quantity of impurities in each region of the parallel pn layer inside the outermost drift region.

Each region of the parallel layer pn inside the outermost region is sandwiched between the regions of the opposite conductivity type with substantially the same impurity density, and one side of the outermost region is in contact with the high resistance region. For this reason, the quantity to be compensated by the impurities of the opposite conductivity type is decreased, and this increases the net quantity of impurities. This results in the unbalanced depletion, and lowers the withstand voltage. In order to achieve the high withstand voltage, the net quantity of impurities in the outermost region is substantially equal to the net quantity of impurities in each region of the parallel pn layer inside the outermost region.

If first-conductivity-type high resistance region is formed at the periphery of the parallel pn layer, a net quantity of impurities at an end of a second-conductivity-type partition region at a corner part must be substantially equal to a net quantity of impurities in each of the parallel pn layer. If second-conductivity-type high resistance region is formed at the periphery of the parallel pn layer, a net quantity of impurities at an end of a first-conductivity-type drift region at a corner part is substantially equal to a net quantity of impurities in each of the parallel pn layer.

In a method for manufacturing the above-mentioned super-junction semiconductor device, an ion implantation area in an outermost second-conductivity-type partition region is set as being smaller than an ion implantation area in each region of the parallel pn layer inside the outermost partition region, and a net quantity of impurities in the outermost second-conductivity-type partition region is set as being substantially equal to a net quantity of impurities in each region of the parallel pn layer inside the outermost partition region.

The quantity of impurities in the outermost second-conductivity-type drift regions is controlled in the above-mentioned manner.

The outermost first-conductivity-type partition regions are controlled in the same manner.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

A description will hereunder be given of the experiments conducted for developing the present invention and the results of the experiments. In the following description, n or p prefixed to regions and layers mean that majority carriers in these regions and layers are electrons and holes, respectively. A prefix+means a relatively-high impurity density, and a prefix−means a relatively-low impurity density.

Figure 1:
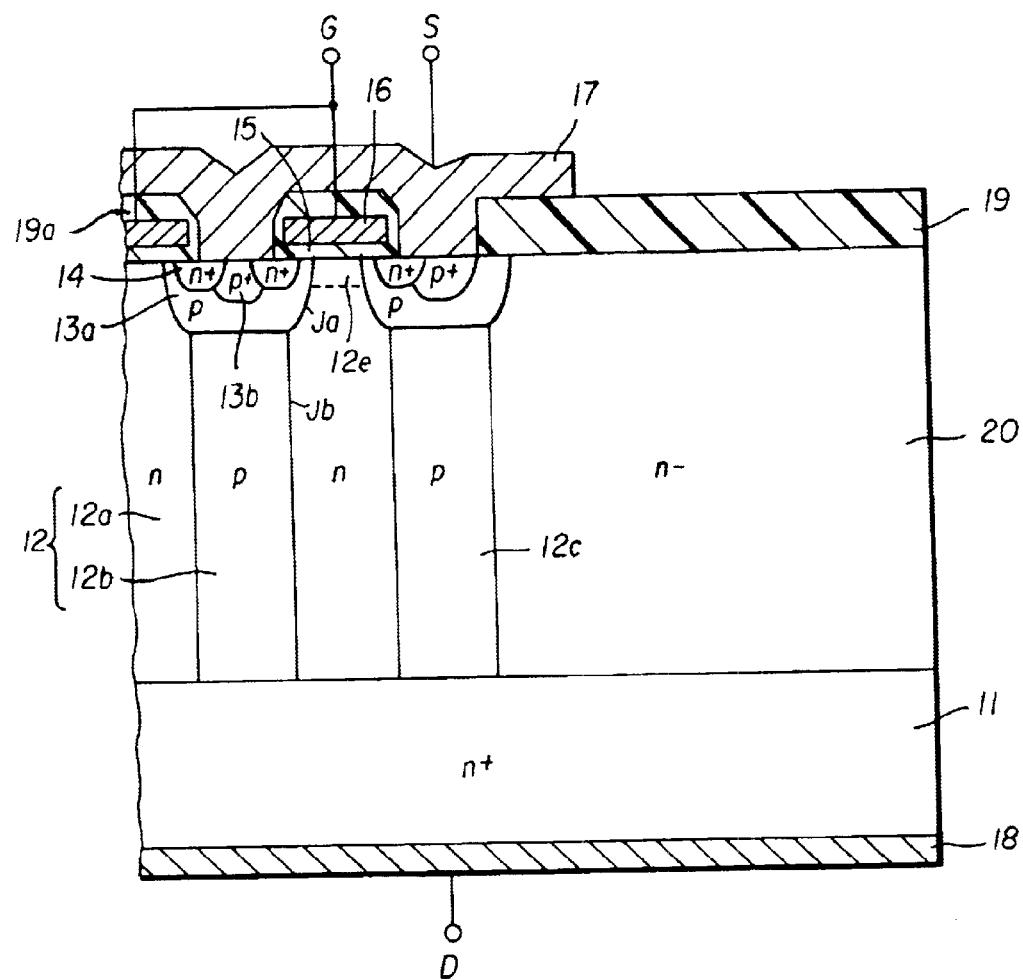
FIG. 1 is a partial sectional view showing a super-junction MOSFET according to the first embodiment of the present invention.

FIG. 1 is a partial sectional view showing the peripheral edge of a longitudinal super-junction MOSFET according to the first embodiment of the present invention. The right-side portion of FIG. 1l shows the end of the n-channel MOSFET. In FIG. 1, reference numeral 11 denotes a low resistance n+ drain layer, and 12 is a drift layer of a parallel pn layer, which is composed of n drift regions 12a and p partition regions 12b. In a surface layer, n-channel regions 12e are connected to the n drift regions 12a, and p-well regions 13a are connected to the p partition regions 12b. As shown, n+ source regions 14 and high-density contact regions 13b are formed inside the p well regions 13a. Gate electrode layers 16 of polycrystalline silicon are formed on the surface of the p well regions 13a between the n+ source regions 14 and the n drift regions 12a through a gate insulating film. A source electrode 17 is also provided on the surfaces of the p well regions 13a, and the source electrode 17 commonly contacts with the surfaces of both the n+ source regions 14 arid the high-density contact regions 13b. A drain electrode 18 is provided at the reverse side of the n+ drain layer. Reference numeral 19 denotes an insulating film for protecting or stabilizing the surface, and the insulating film 19 is made of, for example, thermal oxidization film and phosphorous silica glass (PSG). In many cases, the source electrode 17 extends to the gate electrode layer 16 through interlayer insulating film 19a as shown in FIG. 1. A gate electrode of metal film is provided at a part (not shown) of each gate electrode layer 16. A drift electric current is passed through the n drift regions 12a, but the parallel pn layer including the p partition region 12b will hereafter be referred to as the drift layer 12.

For example, with regard to the plane shape view from the surface of the substrate, the n drift regions 12a and the p partition regions 12b are arranged alternately in stripes. The point is that an n− high resistance region 20 is formed at the peripheral edge of the drift layer 12, which is the basic structure of the super-junction semiconductor device, and outside the p partition regions 12b. The n drift regions 12a and the p partition regions may be arranged in a variety of ways; e.g., either the n drift regions 12a or the partition regions 12b are in rectangular form or in cross stripes and the other is sandwiched therebetween.

For example, the standard size of each part and the impurity density of the MOSFET of the 700V-class take the following values. The specific resistance of the n+ drain layer 11 is 0.01 Ωcm and the thickness thereof is 350 $\mu$m; the thickness of the drift layer 12 is 48 $\mu$m; the width of the n drift region 12a and the p partition region 12b are 5 $\mu$m (i.e., the interval between the centers of the same regions is 10 $\mu$m); the average impurity density of both regions 12a and 12b is $3.5 \times 10^{15} \text{cm}^{-3}$, the diffusion depth of the p well region 13a is 1 $\mu$m; the surface impurity density of the p well region 13a is $1 \times 10^{17} \text{cm}^{-3}$; the diffusion depth of the n+ source region 14 is 0.3 $\mu$m; the surface impurity density of the n+ source region 14 is $1 \times 10^{20} \text{cm}^{-3}$ the impurity density of the n⁻ high resistance region $7.6 \times 10^{13} \text{cm}^{-3}$ or less; and the width of the n⁻ high resistance region 20 is 200 $\mu$m.

The n⁻ high resistance region 20 is formed by, for example, epitaxial growth. The epitaxial growth causes the n drift regions 12a to fill the cavities formed in the n⁻ high resistance region 20, and also causes the p partition regions 12b to fill the cavities formed in the n drift regions 12a.

Figure 2A:
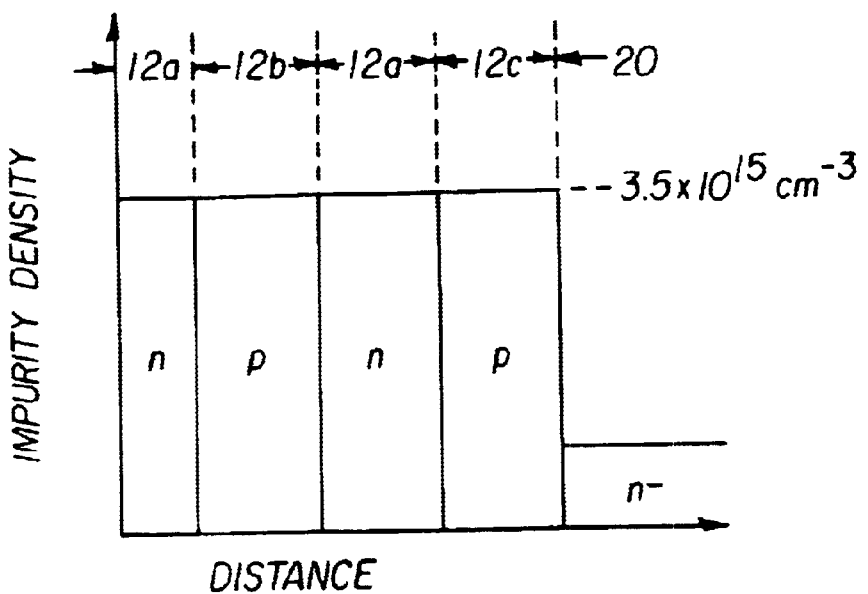
FIG. 2(a) is a a profile of the impurity density of a super-junction MOSFET according to the first embodiment.

FIG. 2(a) shows the profile of the impurity density. The p partition regions 12 and the n drift regions 12b preferably have the same maximum impurity density and substantially the same width so that they can be depleted to have a high withstand voltage.

A description will now be given of the operation of the super-junction MOSFET in FIG. 1 When a predetermined positive voltage is applied to the gate electrode layer 16, the surface layer of the p well region 13a just below the gate electrode layer 16 induces an inversion layer, and electrons are injected into the n channel region 12e from the n+ source region 14 through the inversion layer. The injected electrons reach the n+ drain layer 11 via the drift region 12a, and therefore, the electricity is carried between the drain electrode 18 and the source electrode 17.

When the positive voltage is removed from the gate electrode layer 16, the inversion layer disappears from the surfaces of the p well regions 13a, and the electricity is shut off between the drain electrode 18 and the source electrode 17. If the reverse bias voltage is increased, depletion layers spread into tie a drift regions 12a and the p partition regions 12b from pn junctions Ja between the p well regions 13a and the n− channel regions 12e and pn junctions Jb between the n drift regions 12a and the partition regions 12b, thereby depleting the n drift regions 12a and the p partition regions 12b.

The depletion ends from the pn junctions Jb spread along the width of the n drift regions 12a, and the depletion layers spread from the p partition regions 12b at both sides of the n drift region 12a. Consequently, the n drift regions 12a are depleted very quickly, and this results in the increase in the impurity density of the n drift regions 12a.

At the same time, the p partition regions 12b are also depleted. The depletion layers spread into the p partition regions 12b from the junctions pn at both sides thereof, so that the p partition regions 12b can be depleted quickly. Since the p partition regions 12b and the n drift regions 12a are arranged alternately, the depletion ends spread from the p partition regions 12b into the adjacent n drift regions 12a. This reduces the total width of the p partition regions 12b forming the depletion layer by half, and this results in the increase in the sectional area of the n drift regions 12a.

For example, the conventional longitudinal MOSFET having the single high resistance drift layer requires the drift layer 12 to have the impurity density of $2 \times 10^{-14} \text{cm}^{-3}$ and the thickness of about 80 $\mu$m in order to achieve the withstand voltage of the 700V-class. In the super-junction MOSFET of this embodiment, however, the impurity density of the n drift regions 12a is high, and this reduces the thickness of the drift layer 12. Consequently, the ON resistance can be lowered to about 1/10, and the sufficient withstand voltage can be secured.

Similar n-channel MOSFETs were simulated by changing the impurity density of the n⁻ high resistance region 20, and their characteristics were found by device simulation.

Figure 3:
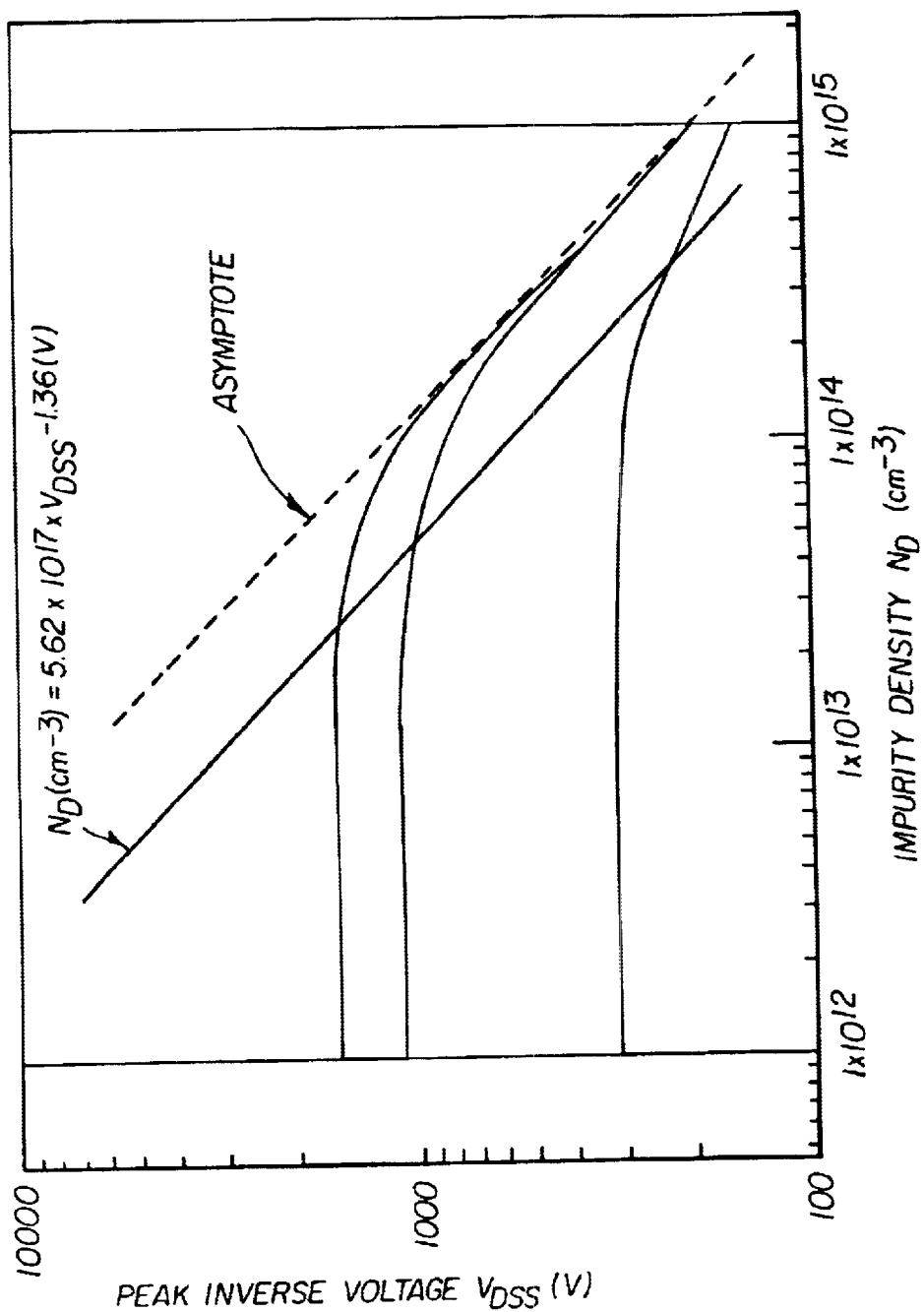
FIG. 3 is a characteristic drawing showing the dependency of the withstand voltage of a super-junction MOSFET according to the first embodiment on the impurity density of n− high resistance region 20.

FIG. 3 is a characteristic drawing showing the dependency of the withstand voltage ($V_{DSS}$) of the n⁻ channel MOSFET on the impurity density. The horizontal axis represents the impurity density of the n⁻ high resistance region 20, and the vertical axis represents the withstand voltage ($V_{DSS}$). The thickness of the drift layer 12 is a parameter, and each line indicates the result of a change in the impurity density of the n⁻ high resistance region 20 with the depth of the drift layer 12 being unchanged.

The withstand voltage as well as the impurity density of the region 20 are decreased when the impurity density $N_D$ of the n⁻ high resistance region 20 is in excess of a value of $5.62 \times 10^{17} V_{dss}^{-1.36}$ ($\text{cm}^{-3}$), and the withstand voltage is almost constant if the impurity density $N_D$ of the ⁻ high resistance region 20 is $5.62 \times 10^{17} V_{dss}^{-1.36}$ ($\text{cm}^{-3}$) or less. This means that the withstand voltage of the device is determined in the internal drift layer 12 regardless of the impurity density of the n⁻ high resistance region 20.

The marginal impurity density is in inverse proportion to the withstand voltage $V_{DSS}$ to the power of 1.36. For this reason, a MOSFET with a high rated voltage must have a low impurity density, whereas a MOSFET with a low rated voltage must have a high impurity density.

The super-junction MOSFET of the first embodiment is provided with the withstand voltage structure that is more simple than ordinarily-adopted guard ring structure and field plate structure. Thus, the super-junction MOSFET can be manufactured in a small number of steps. Of course, the super-junction MOSFET may be provided with the guard ring structure or field plate structure to raise the withstand voltage.

Figure 4:
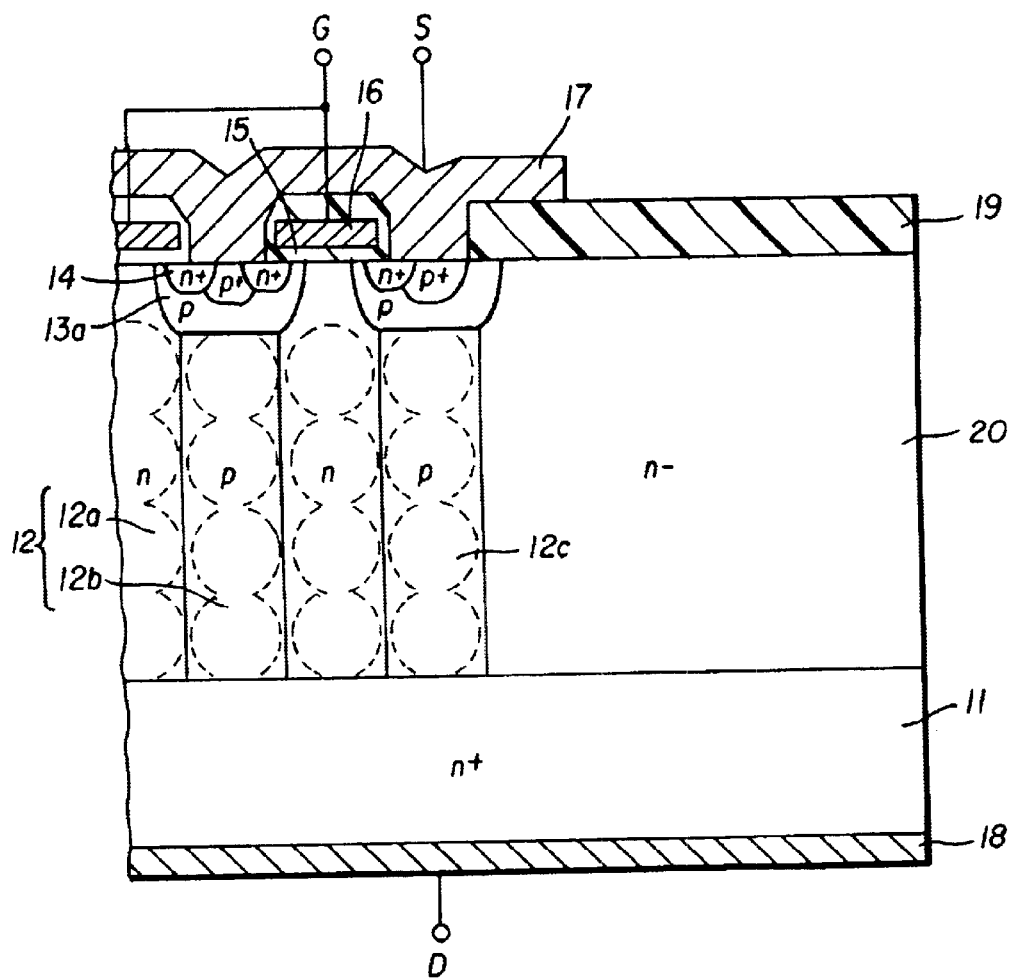
FIG. 4 is a partial sectional view showing a super-junction MOSFET according to the second embodiment of the present invention.

Referring now to a second embodiment of the invention, to manufacture the parallel pn layer of the super-junction MOSFET with the section shown in FIG. 1, the cavities for the impurities are partly formed before the epitaxial growth, and then, the epitaxial growth of the n⁻ high resistance region 20 is repeated several times. Thereafter, the thermal treatment diffuses the n⁻ high resistance region 20 to thereby form the n drift regions 12a and the p partition regions 12b. FIG. 4 is a partial sectional view showing the peripheral edge of the longitudinal super-junction MOSFET that is manufactured in this method.

FIG. 4 is different from FIG. 1 only in that the impurity densities are distributed as indicated by broken lines in the n drift regions 12a and the p partition regions 12b. If the high resistance region 20 is n-type and the outermost side of the parallel pn layer is the p partition region, the outermost p partition region is denoted by 12c, and the inside p partition regions are denoted by 12b. If the selective implantation of the acceptor impurities and the thermal diffusion form the p partition regions 12b, 12c; the withstand voltage, which must be 750V, is lowered to about 600V.

Figure 2B:
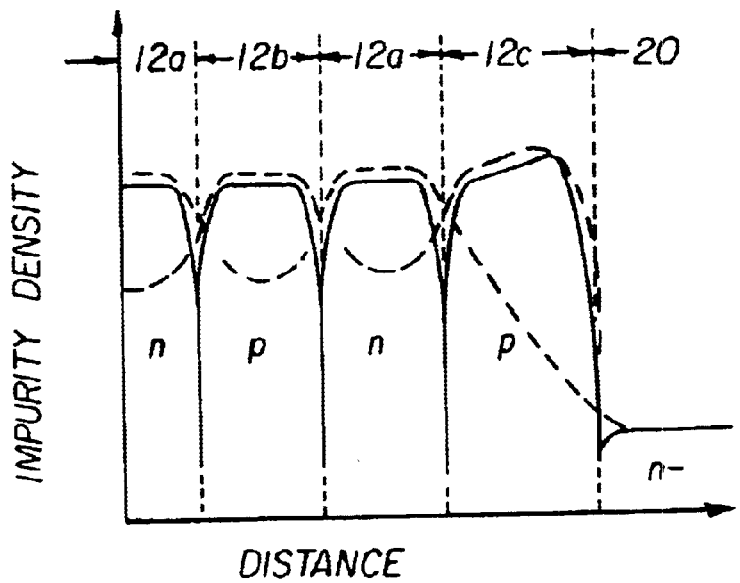
FIG. 2(b) is a profile of the impurity density of a super-junction MOSFET according to the second embodiment.

FIG. 2(b) shows the profile of the impurity density for describing the cause of the decrease in the withstand voltage.

The broken lines indicate the density of donor impurities, and the long and short alternate lines indicate the density of acceptor impurities. The solid line indicates a net impurity density, which is equivalent to a difference in the density between the donor impurities and the acceptor impurities.

If the ions are implanted using the mask with the same width into the p partition regions 12b, 12c, the p partition region 12b are sandwiched between the n drift regions 12a. On the other hand, the n drift region 12a is at one side the p partition region 12c, and the n⁻ high resistance region 20 is at the other side thereof. This decreases the quantity of acceptor impurities in the p partition region 12c, which must be compensated by the n⁻ high resistance region 20.

Consequently, the p partition region 12c is wider than the p partition regions 12b, and the maximum impurity density of the p partition region 12c is higher than that of the p partition regions 12b.

Figure 5:
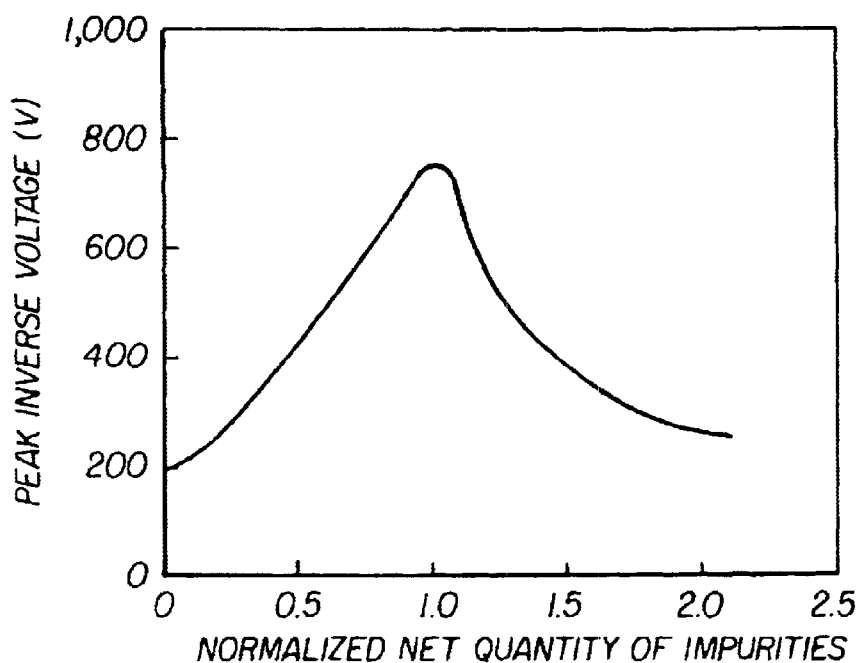
FIG. 5 is a characteristic drawing showing the dependency of the withstand voltage of a super-junction MOSFET according to the second embodiment on the quantity of impurities in a p partition region 12c.

FIG. 5 is a characteristic drawing showing the dependency of the withstand voltage on the net quantity of the impurities in the p partition region 12c. The horizontal axis represents the net quantity of impurities in the p partition region 12c, which is normalized by the net quantity of impurities in the p partition regions 12b. The horizontal axis represents the withstand voltage.

As is clear from FIG. 5, there is the optimum quantity of impurities. If the quantity of impurities in the p partition region 12c is the same as in the p partition regions 12b, the withstand voltage is the maximum. If the quantity of impurities becomes unequal, the withstand voltage is lowered because the requirement that the p partition regions 12b, 12c and the n drift regions 12b have the same quantity of impurities cannot be met.

It is possible to change the width of the mask during the implantation of ions in order to control the net quantity of impurities while the implantation of the ions and the thermal diffusion are forming the p partition regions 12b, 12c at the same time.

Figure 6:
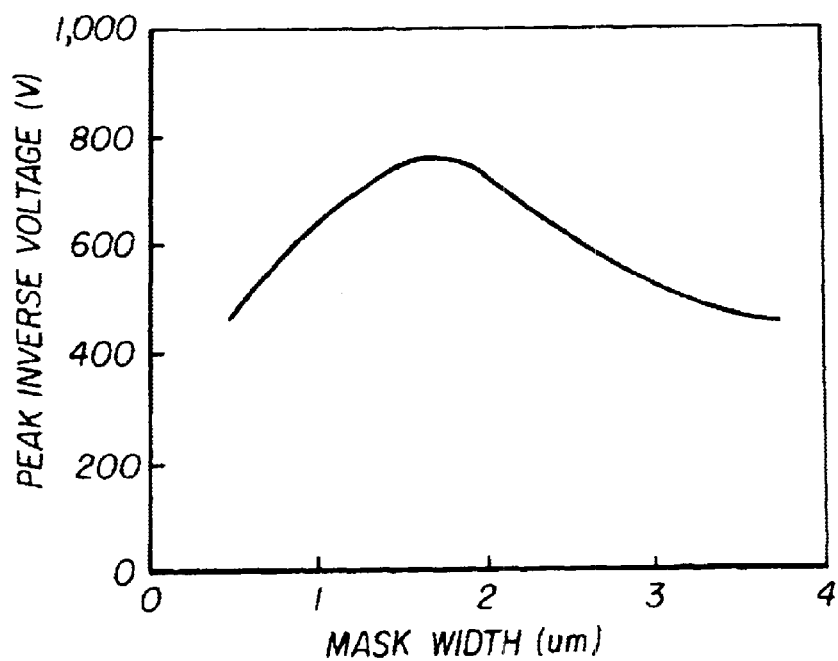
FIG. 6 is a characteristic drawing showing the dependency of the withstand voltage of a super-junction MOSFET according to the second embodiment on the width of a mask for implanting ions into a p partition region 12c.

FIG. 6 is a characteristic drawing showing the dependency of withstand voltage on the mask width for the outermost p partition regions 12c. The horizontal axis represents the mask width for the p partition region 12c, and the vertical axis represents the withstand voltage. The mask width for the p partition regions 12b is 2.5 μm, and the dose of phosphorus is $1×10^{13}$cm⁻².

As is clear from FIG. 6, there is the optimum mask width for the outermost p partition region 12c for maximizing the withstand voltage. If the mask width is larger or smaller than the optimum mask width, the withstand voltage is lowered. The optimum mask width is equal to the total net quantity of impurities in the p partition regions 12b. For example, if the mask width for the outermost partition region 12c is the same as the mask width for the inside p partition regions 12b, the withstand voltage is lowered to about 600V.

Figure 7:
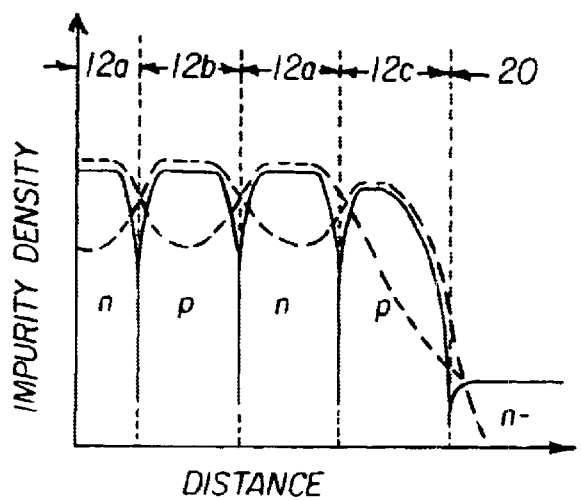
FIG. 7 is a profile of the impurity density of a super-junction MOSFET according to the second embodiment of the present invention.

FIG. 7 shows the profile of the impurity density in the case that the mask width for the p partition region 12c is 1.6 μm. The broken lines indicate the density of donor impurities, and the long and short alternate lines indicate the density of acceptor impurities. The solid line indicates the net density of impurities, which is equivalent to a difference in the density between the donor impurities and the acceptor impurities. Since the quantity of ions to be implanted into the p partition region 12c is decreased, the maximum density of impurities is lowered and the p partition region 12c extends toward the n⁻ high resistance region 20.

Figure 8:
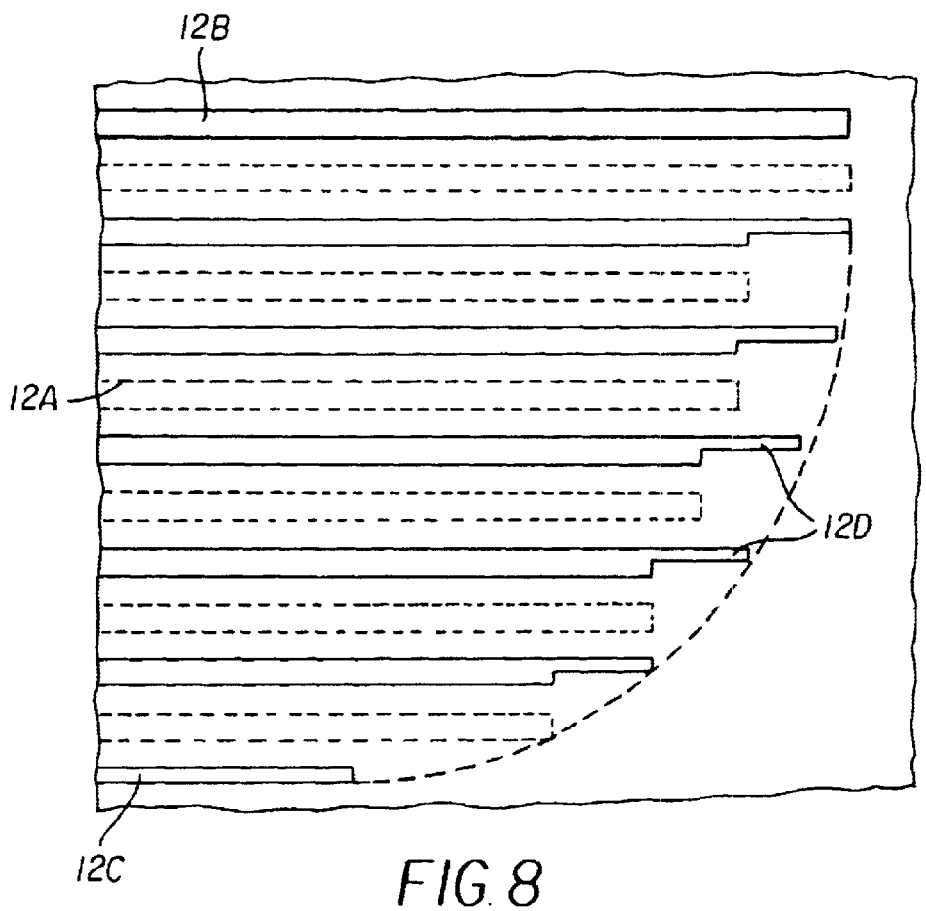
FIG. 8 is an enlarged view showing an ion implantation mask for p partition regions in a super-junction MOSFET according to the second embodiment.

FIG. 8 is an enlarged view showing the corner part of the optimized ion implantation mask. As is clear from FIG. 8, the mask width is narrower at an outermost p partition region formation part 12C and corner p partition region formation end parts 12D. For example, the mask width of an inner p partition region formation part 12B is 2.5 μm, and the mask width of the outermost p partition region formation part 12C and the corner p partition region formation end parts 12D is 1.6 μm. The dotted line 12A indicates a mask for forming the n drift regions. The broken line is, for example, a quarter of a circle, which is formed by connecting the p partition region formation part 12C with the corner p partition region formation end parts 12D. Of course, this also applies to the case that the n drift region is formed at the outermost of the parallel pn layer.

Figure 9:
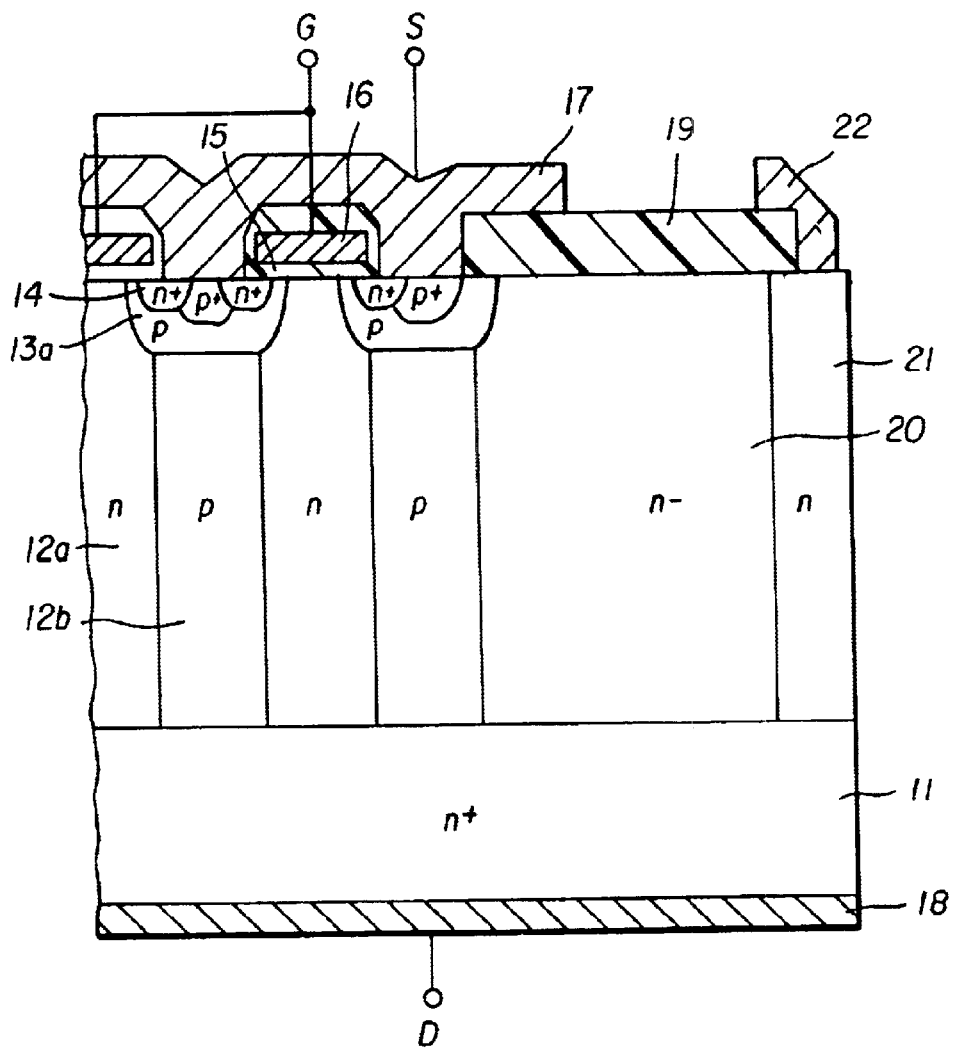
FIG. 9 is a partial sectional view showing a super-junction MOSFET according to the third embodiment of the present invention.
Figure 10:
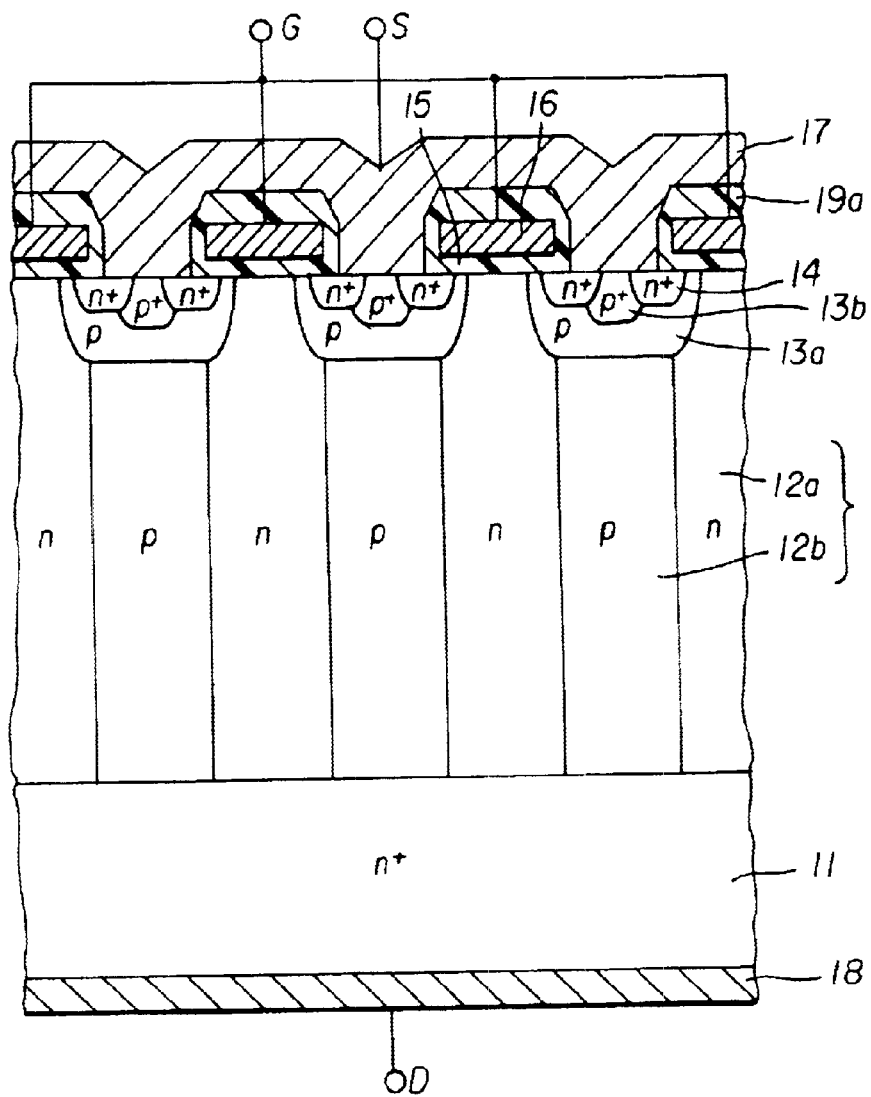
FIG. 10 is a partial sectional view showing the basic structure of a super-junction MOSFET.

FIG. 9 is a partial sectional view showing a longitudinal n-channel super-junction MOSFET according to the third embodiment of the present invention. In FIG. 9, the n⁻ high resistance region 20 is formed at the periphery of the p partition region 12b as in FIG. 1, but a low resistance region 21 is arranged adjacent to the n⁻ high resistance region 20 and connects to the n⁺ drain layer 11. The entire side of the semiconductor chip is covered with the low resistance region 21, and a peripheral edge electrode 22 is provided in contact with the surface of the n low resistance region 21.

In this case, the width of the n high resistance region 20 is, for example, 150 μm, which is narrower than in the first embodiment to thereby achieve the same withstand voltage of the first embodiment.

The low resistance region 21 serves as a channel stopper, and causes the side of the chip to have the potential of the drain electrode. This stabilizes the withstand voltage of the device, and improves the quality of the device.

The n low resistance region 21 is not necessarily formed at the side of the semiconductor chip, but another semiconductor device or semiconductor region may be formed at the opposite side of the semiconductor device across the n low resistance region 21.

In the above description, the n-channel MOSFET is used, but the IGBT can also have the same effects. In addition, a pn diode, a Schottky diode and a bipolar transistor can also have the same effects.

As set forth hereinabove, in the super-junction semiconductor device having a parallel pn layer, in which first-conductivity-type drift regions and second-conductivity-type partition regions are arranged alternately and which conducts electricity in the ON state and being depleted in the OFF state; the first-conductivity-type or second-conductivity-type high resistance region is formed at the periphery said parallel pn layer. This significantly improves the trade-off relation between the ON resistance and the withstand voltage, and easily achieves the high withstand voltage.

Particularly, the impurity density $N_D$ (cm⁻³) of the n⁻ high resistance region is $5.62×10^{17}×V_{DSS}^{-1.36}$(V) or less. This enables the satisfactory spread of the depletion layer, and realizes the semiconductor device with the high withstand voltage. Moreover, the low resistance region is formed at the periphery of the high resistance region, and this improves the stability.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A super-junction semiconductor device comprising:
   first and second principal faces;
   electrodes provided on said first and second principal faces;
   a low resistance layer between said first and second principal faces;
   a parallel pn layer of first-conductivity-type drift regions and second-conductivity-type partition regions alternately arranged, said parallel pn layer being provided between said two principal electrodes and conducting electricity in an ON state and being depleted in an OFF state;
   a high resistance region formed at the periphery of said parallel pn layer;
   a channel-stopper region formed at a periphery of said high resistance region; and
   well regions formed on a side of the first principle face and contacting the parallel pn layer,
   wherein a thickness of said parallel pn layer is greater than a repeating pitch of the alternately arranged first-conductivity-type drift regions and second-conductivity-type partition regions, and
   wherein said channel-stopper region connects to said low resistance layer.

2. The super-junction semiconductor device as defined in claim 1, wherein if a withstand voltage of said super-junction semiconductor device is referred to as $V_{DSS}$ (V), an impurity density ND of the high resistance region at the periphery of said parallel pn layer is $5.62 \times 10^{17} \times V_{DSS}^{-1.36}$.

3. The super-junction semiconductor device as defined in claim 2, wherein said channel-stopper region is of the same conductivity type as said drift region.

4. The super-junction semiconductor device as defined in claim 2, wherein an insulating film is formed on surfaces of said high resistance region.

5. The super-junction semiconductor device as defined in claim 1, wherein said channel-stopper region is of the same conductivity type as said drift region.

6. The super-junction semiconductor device as defined in claim 1, wherein an insulating film is formed on surfaces of said high resistance region.

7. The super-junction semiconductor device as defined in claim 1, wherein said high resistance region is of the first-conductivity-type and a net quantity of impurities in an outermost second-conductivity-type partition region is substantially equal to a net quantity of impurities in each region of said parallel pn layer inside said outermost partition region.

8. The super-junction semiconductor device as defined in claim 7, wherein a net quantity of impurities at an end of a second-conductivity-type partition region at a corner part is substantially equal to a net quantity of impurities in each of said parallel pn layer.

9. The super-junction semiconductor device as defined in claim 1, wherein said high resistance region is of the second-conductivity-type formed at the periphery of said parallel pn layer, and a net quantity of impurities in an outermost first-conductivity-type drift region is substantially equal to a net quantity of impurities in each region of said parallel pn layer inside said outermost drift region.

10. The super-junction semiconductor device as defined in claim 9, wherein a net quantity of impurities at an end of a first-conductivity-type drift region at a corner part is substantially equal to a net quantity of impurities in each of said parallel pn layer.

11. The super-junction semiconductor device as defined in claim 1, wherein interfaces between the alternately arranged first-conductivity-type drift regions and second-conductivity-type partition regions are substantially perpendicular to the first and second principal faces.

12. A super-junction semiconductor device comprising:
   first and second principal faces;
   electrodes provided on said first and second principal faces;
   a low resistance layer between said first and second principal faces;
   a parallel pn layer of first-conductivity-type drift regions and second-conductivity-type partition regions alternately arranged, said parallel pn layer being provided between said two principal electrodes and conducting electricity in an ON state and being depleted in an OFF state; and
   a channel-stopper region of the same conductivity-type as said drift region formed at the periphery of said parallel pn layer; and
   well regions formed on a side of the first principle face and contacting the parallel pn layer,
   wherein a thickness of said parallel pn layer is greater than a repeating pitch of the alternately arranged first-conductivity-type drift regions and second-conductivity-type partition regions, and
   wherein said channel stopper region and said drift regions have a same thickness.

13. A method for manufacturing a super-junction semiconductor device, which comprises first and second principal faces, electrodes provided on said principal faces, a low resistance layer between said first and second principal faces, a parallel pn layer of first-conductivity-type drift regions and second-conductivity-type partition regions arranged alternately, said parallel pn layer being provided between said two principal electrodes and conducting electricity in the ON state and being depleted in the OFF state, a channel-stopper region formed at a periphery of said high resistance region, and well regions formed on a side of the first principle face and contacting the parallel pn layer, wherein a thickness of said parallel pn layer is greater than a repeating pitch of the alternately arranged first-conductivity-type drift regions and second-conductivity-type partition regions, and wherein said channel-stopper region connects to said low resistance layer, said method comprising the steps of:
   providing an ion implantation area in an outermost second-conductivity-type partition region smaller than an ion implantation area in each region of the parallel pn layer inside said outermost partition region,
   forming said parallel pn layer by one or more growth of a first-conductivity-type epitaxial layer on said low resistance layer and ion implanting to dope impurities, and a thermally diffusing the impurities to form said first-conductivity-type drift regions and said second-conductivity-type partition regions, and
   providing a net quantity of impurities in said outermost second-conductivity-type partition region substantially equal to a net quantity of impurities in each region of the parallel pn layer inside said outermost partition region.

14. A method for manufacturing a super-junction semiconductor device, which comprises first and second principal faces, electrodes provided on said principal faces, a low resistance layer between said first and second principal faces, a parallel pn layer, of first-conductivity-type drift regions and second-conductivity-type partition regions arranged alternately, said parallel pn layer being provided between said two principal electrodes and conducting electricity in the ON state and being depleted in the OFF state, a channel-stopper region of the same conductivity-type as said drift region formed at a periphery of said parallel pn layer, and well regions formed on a side of the first principle face and contacting the parallel pn layer, wherein a thickness of said parallel pn layer is greater than a repeating pitch of the alternately arranged first-conductivity-type drift regions and second-conductivity-type partition regions, and wherein said channel-stopper region connects to said low resistance layer, said method comprising the steps of:

- providing an ion implantation area in an outermost first-conductivity-type drift region is smaller than an ion implantation area in each region of the parallel pn layer inside said outermost drift region,
- forming said parallel pn layer by one or more growth of a second-conductivity-type epitaxial layer on said low resistance layer and ion implanting to dope impurities, and thermally diffusing the impurities to form said first-conductivity-type drift regions and said second-conductivity-type partition regions, and
- providing a net quantity of impurities in said outermost first-conductivity-type drift region substantially equal to a net quantity of impurities in each region of the parallel pn layer inside said outermost drift region.

15. A super-junction semiconductor device comprising:

first and second principal faces;

electrodes provided on said first and second principal faces;

a low resistance layer between said first and second principal faces;

a parallel pn layer of first-conductivity-type drift regions and second-conductivity-type partition regions alternately arranged, said parallel pn layer being provided between said two principal electrodes and conducting electricity in an ON state and being depleted in an OFF state; and a channel-stopper region of the same conductivity-type as said drift region formed at the periphery of said parallel pn layer; and well regions formed on a side of the first principle face and contacting the parallel pn layer, wherein a thickness of said parallel pn layer is greater than a repeating pitch of the alternately arranged first-conductivity-type drift regions and second-conductivity-type partition regions, and wherein said channel-stopper region connects to said low resistance layer.

16. A super-junction semiconductor as defined in claim 15, wherein said channel-stopper region is located at a side surface of the super-junction semiconductor device.

17. A super-junction semiconductor as defined in claim 15, wherein said channel-stopper region surrounds said parallel pn layer.

18. A super-junction semiconductor as defined in claim 15, further including a channel-stopper electrode connects to said channel-stopper region.

19. The super-junction semiconductor device as defined in claim 15, wherein interfaces between the alternately arranged first-conductivity-type drift regions and second-conductivity-type partition regions are substantially perpendicular to the first and second principal faces.

* * * * *